United States Patent [19]

Igarashi

[11] 4,152,669

[45] May 1, 1979

[54] PHASE LOCKED LOOP WITH MEANS FOR PREVENTING LOCKING AT UNDESIRED FREQUENCIES

[75] Inventor: Sadao Igarashi, Soma, Japan

[73] Assignee: Alps Electric Co., Ltd., Japan

[21] Appl. No.: 865,431

[22] Filed: Dec. 29, 1977

[30] Foreign Application Priority Data

Dec. 30, 1976 [JP] Japan ............................... 51-159383

[51] Int. Cl.² ............................................. H03B 3/04
[52] U.S. Cl. ........................................ 331/16; 331/17; 331/25
[58] Field of Search ........................ 331/16, 17, 18, 25, 331/14

[56] References Cited

U.S. PATENT DOCUMENTS

| | | | |
|---|---|---|---|
| 3,903,482 | 9/1975 | Pausini et al. | 331/25 X |
| 3,921,094 | 11/1975 | Schaible | 331/25 X |
| 3,939,429 | 2/1976 | Löhn et al. | 325/432 |
| 4,011,520 | 3/1977 | Schaefer | 331/16 X |
| 4,048,582 | 9/1977 | Ihara | 331/16 |

OTHER PUBLICATIONS

Alberkrack, "A Phase-Locked Loop Tuning System for Television", Motorola Application Note AN-744, pp. 1-12, (date unknown).

*Primary Examiner*—Siegfried H. Grimm
*Attorney, Agent, or Firm*—Guy W. Shoup; Gerard F. Dunne

[57] ABSTRACT

Disclosed is a phase locked loop (PLL) circuit adapted for use, for example, in TV tuners. The PLL circuit has a voltage-controlled type oscillator, program divider, a phase detector and a low-pass filter, as is the case of conventional PLL circuits, and in addition, includes means for making the phase of the variable signal input to the phase detector lag behind the phase of the reference signal when a program switch for determining the divisor number of the program divider and a power source switch are operated, or means are provided at the output side of the low-pass filter for preventing the oscillator from oscillating at a frequency higher than one octave above a preselected frequency. These means are each effective to avoid the locking of the PLL circuit at a frequency which is a multiple of the desired frequency, thereby to ensure a safe and stable operation of the circuit in which the PLL circuit is incorporated.

5 Claims, 11 Drawing Figures

PHASE LOCKED LOOP WITH MEANS FOR PREVENTING LOCKING AT UNDESIRED FREQUENCIES

BACKGROUND OF THE INVENTION

The present invention relates to phase-locked loop (PLL) circuits and, more particularly, to PLL circuits adapted to prevent voltage-controlled oscillators operable over a wide frequency range from locking at a frequency higher than desired.

PLL circuits have been conventionally used in, for example, tuners for televisions. These conventional PLL circuits have, however, suffered from a disadvantage in that the circuit is apt to be locked at a frequency which is a multiple of the desired output frequency, as will be detailed below.

It is therefore an object of the invention to overcome the above described shortcoming of the prior art by providing an improved PLL circuit capable of avoiding unintentional locking of the circuit at a frequency multiple of the destined frequency.

To this end, according to the invention, there is provided a PLL circuit in which the phase of the variable signal which is input to a phase detector in the PLL circuit is suitably made to lag behind the phase of the reference signal, at the time of operation of a program switch which determines a divisor number of a program divider, and a power source switch, whereby the circuit is prevented from being locked at the above stated multiple frequency. Alternatively, means may be provided at the output side of a low-pass filter in the PLL circuit for preventing the controlled oscillator of the circuit from oscillating at a frequency which is higher than a preselected frequency by an octave or a larger frequency range width.

The above and other objects, as well as advantageous features of the invention will become clear from the following description of the preferred embodiments of the invention taken in conjunction with the attached drawings in which:

DESCRIPTION OF THE PREFERRED EMBODIMENTS

Before turning to the description of the preferred embodiments, an explanation will be made hereinbelow as to a typical conventional PLL circuit so as to recognize the drawbacks of the prior art, which, it is believed, will be of a great help in understanding the advantages of the present invention.

Figure 1:
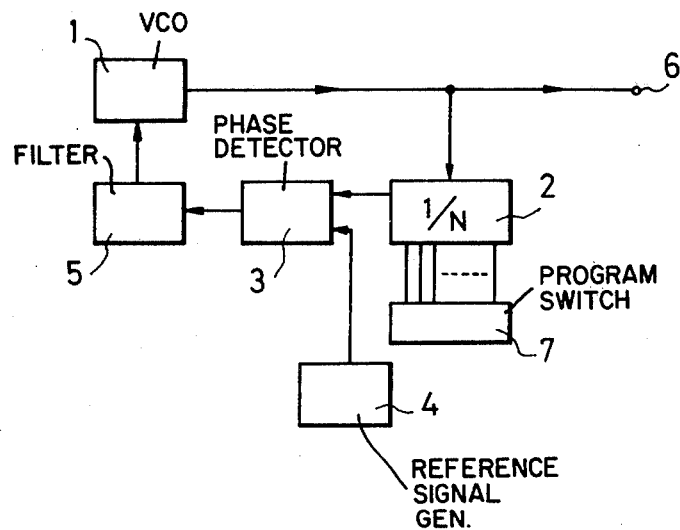
FIG. 1 is a block diagram of a conventional PLL circuit.

Referring to FIG. 1, a conventional PLL circuit generally consists of a voltage-controlled type oscillator (VCO) 1, a program divider 2, a phase detector 3, a reference signal generator 4 and a low-pass filter 5.

The arrangement is such that the signal from the VCO 1 is output to an output terminal 6, and a part of the output signal is applied to the program divider 2. The program divider 2 is adapted to divide the signal by a desired number, and the output of the program divider is transmitted to the phase detector 3 which also receives a reference signal transmitted from the reference signal generator 4.

The phase detector 3 is adapted to perform a comparison of the above two inputs with each other, and to produce a positive or negative pulse or signal in accordance with the advance or lag of the phase of the variable signal to the phase of the reference signal. A d.c. component of this resultant signal is then passed by the low-pass filter 5, to a voltage responsive element such as a varactor diode adapted to control the oscillation frequency of the voltage-controlled type oscillator 1. The oscillation frequency of the VCO 1 is locked when the two inputs to the phase detector 3, i.e. the reference signal and the variable signal from the program divider, are synchronized with each other.

Thus, the oscillating frequency of the VCO is determined by the divisor number given to the program divider 2 which number is determined by a program switch 7 connected to the program divider 2.

FIGS. 2a to 2d are time charts for the reference signal and signals of circuit elements of the PLL circuit of FIG. 1.

Figure 2:
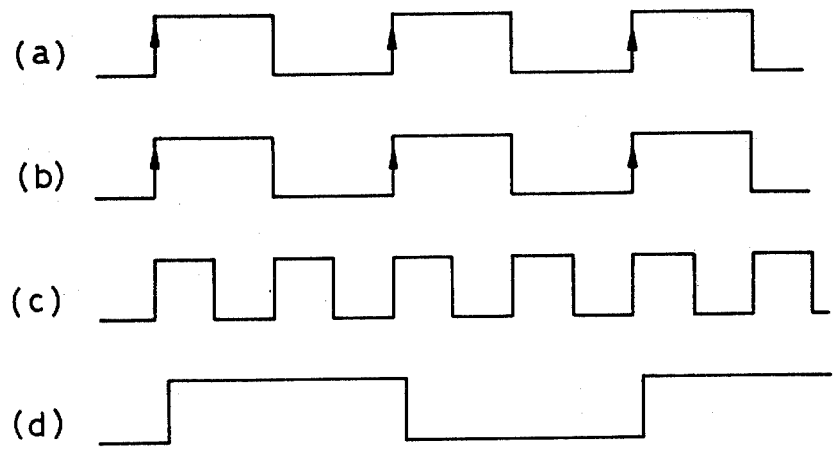
FIGS. 2 shows time charts for explaining the operation of PLL circuits.

The phase comparison at the phase detector 3 is made when the signal applied to the program divider 2 is above 1 octave of the reference pulse signal, in the PLL circuit of FIG. 1, on the basis of the rising or falling of the reference pulse signal. At the same time, since the low-pass filter 5 has a voltage preservation function, the loop is locked when relationship of the curve of FIG. 2a to that of FIG. 2c is established, i.e. when the frequency of the VCO signal is double, triple, four times, etc. that of the frequency of the reference signal, when the program switch 7 and the power switch are turned on. This results in an inconvenience in that the frequency actually obtained at the output terminal 6 may differ from a destined or desired frequency. For information, the relationship between the waveforms of FIGS. 2a and 2b represents that the phase and frequencies of the reference signal and the variable signal coincide with each other, respectively, to allow the locking of the circuit in an operating condition of the latter.

According to the prior techniques, the above stated inconvenience is avoided by selecting a suitable frequency relationship in a frequency converter constituting a stage prior to the program divider 2, such that the signal input to the program divider 2 is below the 1 octave.

However, when it is required to control the localoscillation frequency signal of a tuner for TV by only one PLL circuit, it is meaningless to put a frequency converter at the previous stage of the program divider 2, because the localoscillation frequency signal varies over a wide range of frequency of from about 100 to 1000 MHz. In order to control a signal of this kind, it has been proposed to directly divide the oscillated frequency, however, the signal input to the program divider 2 inevitably becomes wider than the 1 octave.

The present invention aims at overcoming the above described problem of the prior art by providing an improved PLL circuit capable of avoiding the locking of the loop at a condition wherein the frequency of the variable signal is a multiple of that of the reference signal, for example, by ensuring that the input signal to the program divider is, at least initially, smaller than the 1 octave, even when the controlled oscillation frequency varies over a wide range.

The above stated object of the invention is fulfilled by making the phase of the signal input to the phase detector from the program divider lag behind the reference signal, soon after the program switch and the power switch are turned on, or by providing a circuit at the output side of the low-pass filter, for preventing the signal input to the program divider from becoming wider than 1 octave.

The invention will be more fully understood from the following description of the embodiments taken in conjunction with the attached drawings.

Figure 3:
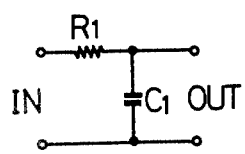
FIGS. 3, 4 and 5 are connection diagrams of conventional low-pass filters.
Figure 4:
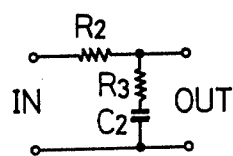
Figure 5:
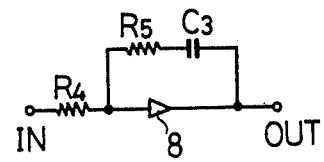

Referring at first to FIGS. 3 and 4, the output voltage of the low-pass filter thereof becomes high, when the voltage across the capacitors $C_1$ or $C_2$ is high. In the circuit of FIG. 5, the output voltage varies in accordance with the circuit arrangement. However, for the purpose of simplification of the explanation, an assumption is made here that the output voltage becomes high when the voltage across the capacitor $C_3$ is high.

Figure 6:
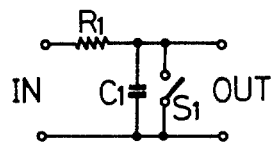
FIGS. 6, 7 and 8 are diagrams showing low-pass filters of PLL circuits in accordance with the present invention.
Figure 7:
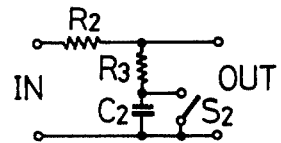
Figure 8:
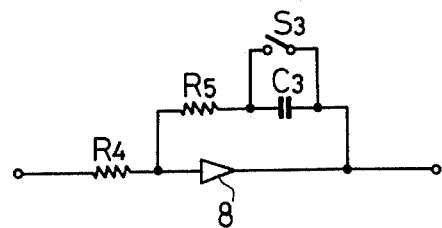

In good contrast to the above, in the circuits of FIGS. 6 to 8, switches $S_1$, $S_2$ and $S_3$ are interlocked with the program switch 7 and a power source switch, so that the switches $S_1$, $S_2$ or $S_3$ can be instantaneously short-circuited as the program switch 7 and the power source switches are operated. As the result of this short-circuiting, the output voltage of the low-pass filter is lowered accordingly. Therefore, the oscillation frequency of the voltage-control type oscillator 1 is lowered to its minimum when the program switch 7 and the power source switch are turned on so as to make the phase of the variable signal input to the program divider 2 lag behind the phase of the reference signal, regardless of the divisor number given to the program divider 2.

Namely, as shown in FIG. 2d, the variable signal is started with a certain time lag with respect to the reference signal of FIG. 2a. The phase of the variable signal from the program divider is then gradually put ahead as the switches $S_1$, $S_2$ and $S_3$ are opened by suitable means, and the loop is locked when the relationship as shown in FIGS. 2a and 2b is established between both these frequencies. Therefore, the loop can by no means be erroneously locked at a condition in which the frequency of the variable signal is a multiple of that of the reference signal, and a desired output frequency is obtained at the output terminal 6.

Figure 9:
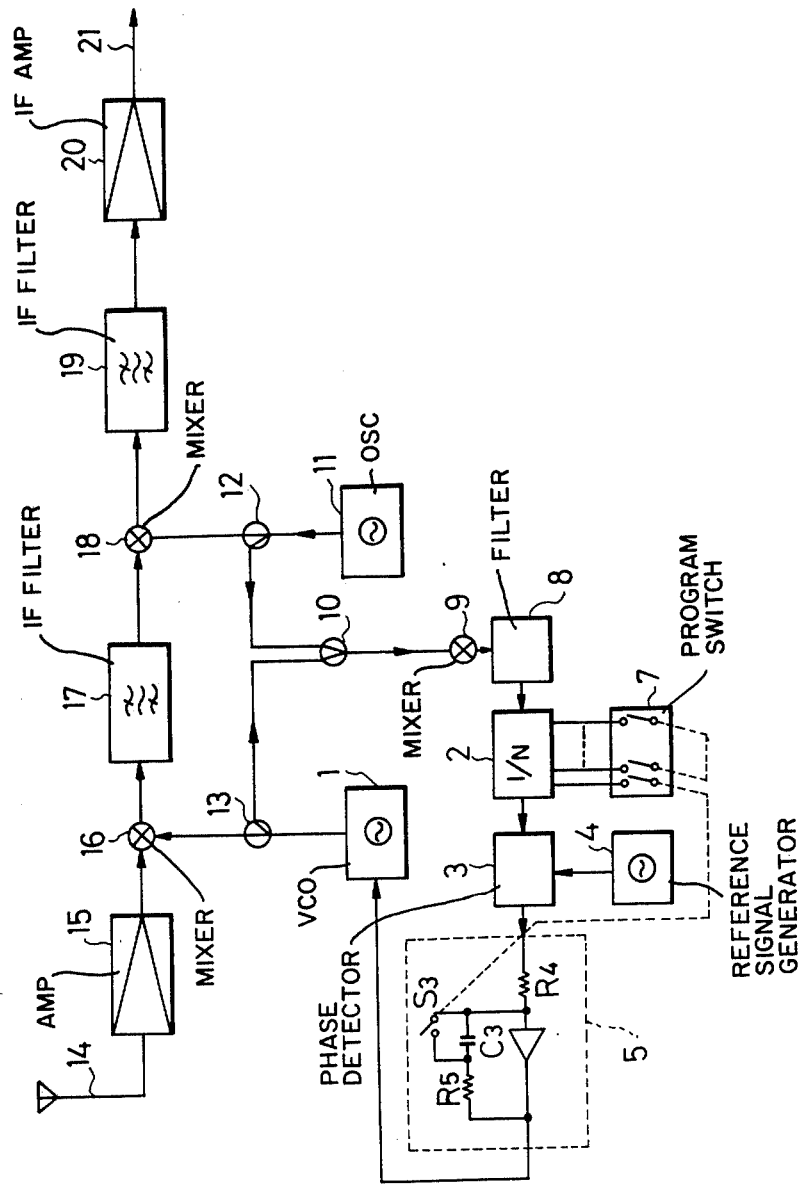
FIG. 9 is a block diagram of an embodiment of the invention incorporated in a tuner for a television.

FIG. 9 shows a block diagram of a circuit in which the PLL circuit of the invention is used in a TV tuner.

This tuner is a VHF/UHF all channel tuner of double superheterodyne type basically consisting of an antenna 14, a broad-band amplifier 15, a first mixer 16, a first voltage-controlled type oscillator 1, a first IF filter 17, a second mixer 18, a second oscillator 11 for oscillating at a fixed frequency, a second IF filter 19, a second IF amplifier 20 and a PLL circuit portion.

The frequency relationships of this tuner will be described on an assumption that this tuner is used in Japan.

Provided that the first IF frequency is to be 2000 MHz, the output frequencies of the first oscillator 1 and the second oscillator 11 are set, respectively, from 2091.25 MHz to 2765.25 MHz, and 1941.25 MHz, respectively. (Refer, for example, to the tuner disclosed in Japanese Patent Laid-Open Publication No. 71215/1975, which corresponds to United States Pat. No. 3,939,429 issued Feb. 17, 1976).

Then, representing the receiving frequency, first IF frequency, second IF frequency, frequency of the first oscillator and the frequency of the second oscillator by $F_{IN}$, $F_{IF1}$, $F_{IF2}$, $F_{OSC1}$ and $F_{OSC2}$, respectively, the following equations are established.

$$F_{IF1} = F_{OSC1} - F_{IN} \quad (1)$$

$$F_{IF2} = F_{IF1} - F_{OSC2} \quad (2)$$

The following equation (3) is derived from the equations (1) and (2).

$$F_{IF2} = (F_{OSC1} - F_{OSC2}) - F_{IN} \quad (3)$$

The frequency $F_{IN}$ is the frequency of a signal transmitted from a TV station and, therefore, involves only small deviation and fluctuation, i.e., it is highly accurate.

Therefore, it can be seen from the above equation 3 that the fluctuation of the frequency $F_{IF2}$ is attributable mainly to the fluctuation of the value of ($F_{OSC1} - F_{OSC2}$). Thus, when a desired channel has been selected, the value of $F_{IF2}$ is kept stationary, as long as the value of ($F_{OSC1} - F_{OSC2}$) is kept constant.

When this frequency value of $F_{OSC1} - F_{OSC2}$ is input to the PLL circuit, so as to control the frequency of the first oscillator 1 upon comparison of the phase of the input signal with that of a reference signal, the values of $F_{OSC1} - F_{OSC2}$ and $F_{IF2}$ can be maintained constant, as a natural output from the PLL circuit.

The frequency $F_{OSC1} - F_{OSC2}$ can assume a value which is the local frequencies of present VHF and UHF tuners, i.e. 150 to 824 MHz, irrespective of the first IF frequency and the like. The frequency range of 150 to 824 MHz is clearly wider than 1 octave. Therefore, for the reason stated above, there is a fear that the circuit may become locked to output an unintended frequency, when the program switch (or channel switch) and the power source switch are operated, if a conventional PLL system is used.

However, the circuit of FIG. 9 is entirely free from such a fear because it incorporates the circuit of FIG. 8.

The PLL circuit incorporated into the circuit of FIG. 9 is constituted by, in addition to the first and the second oscillators 1 and 11, a distributor 13 for distributing the signal from the first oscillator 1, a distributor 12 for distributing the signal from the second oscillator, a composer 10 for composing the two oscillated signals, a mixer 9 for the PLL, a low-pass filter 8 adapted to produce a signal representative of the frequency differential between the first and the second signals, a program switch 7, a phase detector 3, a reference signal generator 4 and a low-pass filter 5.

The switch $S_3$ associated with the capacitor $C_3$ of the low-pass filter 5 is interlocked with the program switch 7 and the power source switch, and is adapted to short-circuit the capacitor instantaneously soon after these switches are closed.

Figure 10:
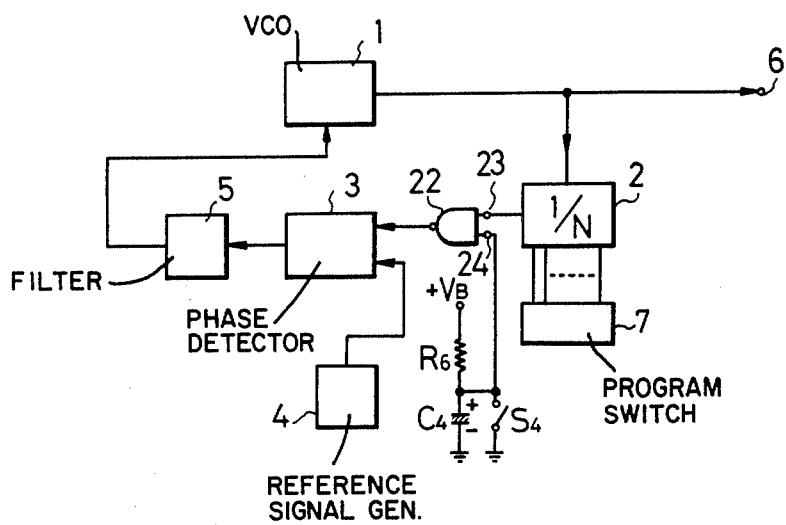
FIGS. 10 and 11 are block diagrams of PLL circuits which are each different embodiments of the present invention.

Referring now to FIG. 10 showing a block diagram of a PLL circuit which constitutes another embodiment of the present invention, a gate circuit 22 is provided between the program divider 2 and the phase detector 3. The arrangement is such that one of the inputs to the gate circuit 22 is made a digital signal "0" at the time of switching of the frequencies, to put the phase of the reference signal ahead irrespective of the phase of the variable signal. Thus, the voltage-controlled type oscillator 1 is forced to temporarily output its minimum frequency, before the ordinary PLL operation is started. In the circuit of FIG. 10, similar circuit elements to those of FIG. 1 are denoted by the corresponding reference numerals.

More specifically, the gate circuit 22 is constituted by a NAND circuit. A gate 23 is adapted to receive the output from the program divider 2, while another gate 24 is adapted to receive a D.C. voltage from a circuit consisting of a resistance $R_6$ and a capacitor $C_4$. In the normal PLL operation, a voltage corresponding to the source voltage VB, i.e. the voltage corresponding to a digital signal "1", is applied to the gate 24 by the circuit consisting of the resistance $R_6$ and a capacitor $C_4$, with the switch $S_4$ associated with the capacitor $C_4$ turned to off.

Consequently, in the normal operation, the signal of the gate 23 emerges as the gate circuit output, so as to allow the PLL circuit to function in the normal manner. Although the signal is inverted by the NAND circuit 22, the operation is not affected because the signal of the gate 23 is a continuous repeated signal.

The switch $S_4$ is interlocked with the program switch 7 and the power source switch, and is adapted to short-circuit when these switches are operated. When the switch $S_4$ is short-circuited, the capacitor $C_4$ discharges and the voltage of the gate 24 is lowered accordingly. As this voltage is a digital signal "0", the gate circuit 22 is turned to off, and the output from the NAND circuit 22 assumes a higher value, i.e. a digital signal "1". The phase detector 3 assumes an advanced phase when the output from the gate circuit 22 is "1", and produces a negative pulse as its output. Assuming that the circuit of FIG. 5 is used for constituting the low-pass filter 5, the negative output pulse from the phase detector 3 acts to lower the potential of the capacitor $C_3$ which in turn lowers the output voltage of the low-pass filter 5 and further makes the oscillating frequency of the oscillator 1 low.

This state is preserved until the gate 24 is switched to "1" by suitable means. Therefore, by keeping the gate 24 at the state of "0" for a suitable period of time after the short-circuiting of the switch $S_4$, the oscillating frequency is lowered to its minimum.

The potential of the gate 24 after the short-circuiting of the switch $S_4$ is gradually elevated from the condition of "0", at a rate determined by the time constant of the circuit constituted by the capacitor $C_4$ and the resistance $R_6$, to "1" and finally to the voltage equal to that VB of the source.

For instance, when the gate circuit 22 is of CMOS type, the gate 24 is turned to "1" as the voltage across the capacitor $C_4$ comes up to ½ of the source voltage. The capacitance of the capacitor $C_4$ and the value of the resistance $R_6$ are so selected that the oscillating frequency is lowered to its minimum, within a time until the gate 24 comes to assume "1" after the short-circuiting of the switch $S_4$, regardless of the oscillating frequency before the short-circuiting. Thus, the oscillating frequency assumes its minimum value whenever the PLL operation is started, while the phase detector 3 is lagging, so that it is impossible for the circuit to be erroneously locked at a frequency which is a multiple of the reference frequency.

Figure 11:
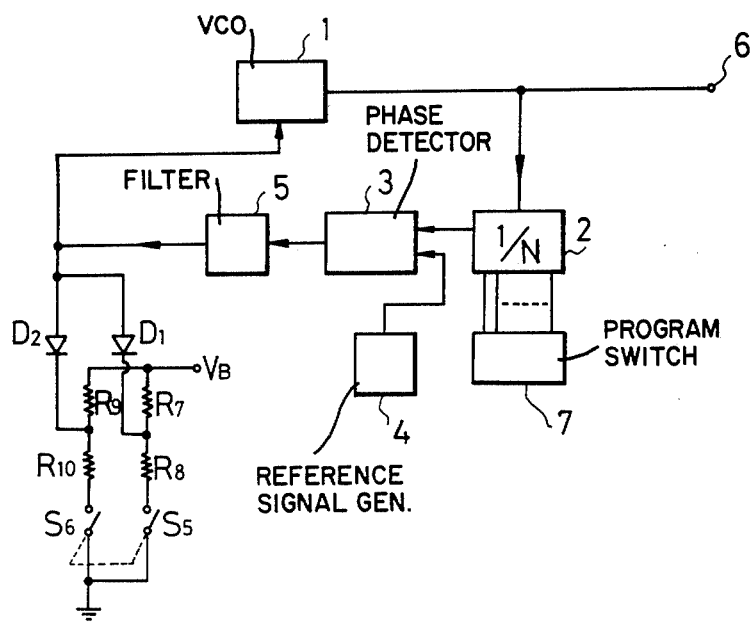

Referring now to FIG. 11 showing a block diagram of still another embodiment of the present invention, circuit elements denoted by numerals 1 to 7 are the same as those designated by the same numerals in FIG. 1. This circuit is, however, provided with a circuit adapted to clip the output voltage from the low-pass filter 5.

The voltage clipping circuit is constituted by diodes $D_1$, $D_2$, resistances $R_7$ to $R_{10}$, and switches $S_5$ and $S_6$. The resultant resistance of resistances $R_9$ and $R_{10}$, and the resultant resistance of the resistance $R_7$ and $R_8$ are selected to be sufficiently lower than the resultant impedance of the output impendance of the low-pass filter 5 and the impedance of the oscillator terminal of the oscillator 1 to which the controlling voltage is applied.

The output voltage of the low-pass filter 5 cannot go any higher than the value determined by the resistances $R_7$ and $R_8$ (or $R_9$ and $R_{10}$), when the switch $S_5$ (or switch $S_6$) is short-circuited.

The undesirable locking of the circuit at a frequency which is a multiple (double, triple, 4 times, etc.) of the reference frequency can fairly be avoided by preventing the oscillator 1 from oscillating at a frequency higher than an octave or more of a selected frequency, even when the range of the output frequency from the oscillator 1 exceeds one octave.

The resistances $R_7$, $R_8$ and $R_9$, $R_{10}$ are so selected so as not to allow an oscillation of a frequency higher by an octave or more than the desired frequency. For instance, assuming here that the oscillating frequency range of 150 to 824 MHz for the oscillator 1 is divided into three regions of 150 to 280 MHz, 270 to 520 MHz and of 500 to 824 MHz, and that the oscillation of only the first frequency region of 150 to 280 MHz is intended, the values of the resistances $R_7$ and $R_8$ are selected so as not to allow the oscillation at 300 MHz. For oscillation at the middle frequency range of 270 to 520 MHz, the values of the resistances $R_9$ and $R_{10}$ are selected so as not to allow the oscillation at 540 MHz. At the same time, the switches $S_5$ and $S_6$ are so operated that the switch $S_5$ is on and the switch $S_6$ is off for the control of 150 to 280 MHz, and that the switch $S_6$ is turned on while the switch $S_5$ is turned off for the control of 270 to 520 MHz. For the control of 500 to 824 MHz, both of the switches $S_5$ and $S_6$ are turned off. The aforementioned inconvenience can be avoided by constructing and operating the circuit in the described manner.

It is to be noted that the switches $S_5$ and $S_6$ may be interrelated with the program switch 7, but it is not necessary to make the switches $S_5$ and $S_6$ interlocked with the power source switch, in good contrast to the circuit of FIG. 10.

It will be understood from the foregoing description that the locking of the loop at a frequency which is a multiple of the reference frequency can effectively be avoided, even when the range of frequency controlled by PLL circuit is considerably large, by making the variable signal input to the phase detector lag behind the reference signal at the time of operation of the program and the source switches, or by preventing the signal input to the program divider from spreading over one octave or wider.

What is claimed is

1. A phase locked loop (PLL) circuit having
   a voltage-controlled oscillator operable over a wide frequency range including at least one octave, said oscillator including a voltage responsive element adapted to control the frequency of said oscillator;

means including a program divider for receiving a part of the output signal from said oscillator and dividing the frequency of said output signal to produce a lower signal variable correspondingly with said oscillator output signal;

means for producing a reference signal;

a phase detector receiving said lower signal and said reference signal for comparing them and producing a resultant signal in accordance with the advance or lag of the phase of said lower signal compared with that of said reference signal;

means including a low-pass filter receiving said resultant signal for passing a D.C. component thereof to said voltage responsive element; and means operable during at least the start of operation of the PLL circuit for regulating the voltage passed to said voltage responsive element so as to keep the frequency of said oscillator output signal within limits ensuring proper operation of the PLL circuit;

said regulating means being constituted by means connected between said filter and said voltage responsive element for limiting the oscillator form oscillating at a frequency higher than one octave above a preselected frequency;

said last mentioned means being constituted by a plurality of voltage clipping circuits each being adapted to cut-off the voltage from said filter at a respective value.

2. A phase locked loop (PLL) circuit having a voltage-controlled oscillator operable over a wide frequency range including at least one octave, said oscillator including a voltage responsive element adapted to control the frequency of said oscillator;

means including a program divider for receiving a part of the output signal from said oscillator and dividing the frequency of said output signal to produce a lower signal variable correspondingly with said oscillator output signal;

means for producing a reference signal;

a phase detector receiving said lower signal and said reference signal for comparing them and producing a resultant signal in accordance with the advance or lag of the phase of said lower signal compared with that of said reference signal;

means including a low-pass filter receiving said resultant signal for passing a D.C. component thereof to said voltage responsive element;

means operable during at least the start of operation of the PLL circuit for regulating the voltage passed to said voltage responsive element so as to keep the frequency of said oscillator output signal within limits ensuring proper operation of the PLL circuit;

a program switch connected to said program divider for setting a divisor number therein; and a power source switch;

said regulating means including means inter-related with said program switch and said power switch for making the phase of said lower signal lag behind the phase of said reference signal when said program switch and said power switch are actuated.

3. A PLL circuit according to claim 2, said filter including a capacitor; and said last mentioned means comprising a switch adapted to be operated when said program switch and said power switch are actuated for discharging said capacitor so as to lower to a minimum the voltage input to said voltage responsive element.

4. A PLL circuit according to claim 2, said last mentioned means comprising a gate circuit connected between said program divider and said phase detector; and means including a switch interconnected with said program switch and said power switch for operating said gate circuit so that the frequency of the variable signal input to said phase detector is temporarily decreased to a level below that of said reference signal and then brought back to its original level.

5. A PLL circuit according to claim 4, said gate circuit being constituted by a NAND gate having a first input receiving said lower signal; and said gate circuit operating means including a resistance-capacitance timing circuit adapted to be connected between a source of control voltage and a second input of said NAND gate; and said switch being connected across said capacitor and adapted to lower the voltage thereof and thus temporarily block said NAND gate when said program switch and said power switch are actuated.

* * * * *